United States Patent
Oda

(10) Patent No.: US 7,656,322 B2
(45) Date of Patent: Feb. 2, 2010

(54) SEMICONDUCTOR MEMORY DEVICE HAVING ERROR CORRECTION FUNCTION

(75) Inventor: Daisuke Oda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/175,473

(22) Filed: Jul. 18, 2008

(65) Prior Publication Data

US 2009/0073009 A1    Mar. 19, 2009

(30) Foreign Application Priority Data

Sep. 14, 2007    (JP) ............... 2007-239614

(51) Int. Cl.
*H03M 13/00*    (2006.01)
(52) U.S. Cl. ................... 341/94; 714/718
(58) Field of Classification Search ............ 341/94, 341/50, 51; 714/755, 804, 718; 360/53
See application file for complete search history.

(56) References Cited

U.S. PATENT DOCUMENTS

| | | | | |
|---|---|---|---|---|
| 5,638,385 | A | * | 6/1997 | Fifield et al. ............ 714/763 |
| 5,963,488 | A | | 10/1999 | Inoue |
| 6,119,251 | A | * | 9/2000 | Cloud et al. ............ 714/718 |
| 6,275,960 | B1 | * | 8/2001 | Cappelletti et al. ..... 714/718 |
| 7,076,722 | B2 | | 7/2006 | Shibata |
| 2004/0255224 | A1 | | 12/2004 | Yabe |
| 2006/0195766 | A1 | | 8/2006 | Shibata |
| 2008/0040652 | A1 | * | 2/2008 | Ausserlechner ......... 714/804 |

FOREIGN PATENT DOCUMENTS

| | | |
|---|---|---|
| JP | 58215797 | 12/1983 |
| JP | 60188000 | 9/1985 |
| JP | 62146500 | 6/1987 |
| JP | 04074400 | 3/1992 |
| JP | 05-241868 | 9/1993 |
| JP | 10-255495 | 9/1998 |
| JP | 2003157697 | 5/2003 |
| JP | 2005004876 | 1/2005 |

* cited by examiner

*Primary Examiner*—Brian Young
(74) *Attorney, Agent, or Firm*—Volentine & Whitt, P.L.L.C.

(57) ABSTRACT

A semiconductor memory device configured such that the time required for its access test can be reduced comprising a memory cell array, a row decoder, a column decoder, an error correction circuit, and an output circuit. The error correction circuit performs error correction on a code word read through the bit lines selected by the column decoder from ones of memory cells located at places at which the word line selected by the row decoder and the selected bit lines cross over, thereby detecting an error position in the code word to generate error detection data indicating the error position and corrects the information bit in the detected error position to generate error corrected data. The output circuit relays to the outside the error corrected data when a normal operation mode has been designated and the error detection data when a test operation mode has been designated.

16 Claims, 18 Drawing Sheets

SEMICONDUCTOR MEMORY DEVICE HAVING ERROR CORRECTION FUNCTION

BACKGROUND OF THE INVENTION

1. Field of the Invention

The present invention relates to a semiconductor memory device having an error correction function and particularly to a nonvolatile semiconductor memory device having a high speed read mode as well as an error correction function.

2. Description of the Related Background Art

A nonvolatile semiconductor memory device generally has a memory cell array comprising multiple memory cells arranged in a matrix. As the storage capacity of semiconductor memory devices becomes larger, the probability of the occurrence of a bit error due to a hard error (a malfunction caused by a failure of a memory cell) or a soft error (a malfunction caused by radiation such as alpha rays) becomes higher. Since many years ago, there have been semiconductor memory devices having an ECC circuit to execute error correction on such bit errors. Further, in order to inspect the operation of the ECC circuit and whether a failure exists in a memory cell, an access test is executed which reads data from a semiconductor memory device storing data of a known test pattern under various conditions and verifies the read data pattern with the known test pattern. A conventional technique related to such an access test is disclosed in, e.g., Japanese Patent Kokai No. H05-241868 (Patent Document 1).

Meanwhile, there have been semiconductor memory devices having an operation mode in which to read data at high speed from the memory cell array. Among this type of operation modes, a page access mode and a burst mode are known. Japanese Patent Kokai No. H10-255495 (Patent Document 2) and U.S. Pat. No. 5,963,488 (Patent Document 3) disclose a semiconductor memory device having the page access mode. When operating in the page access mode, this semiconductor memory device reads one page worth of data from a predetermined number of memory cells of the memory cell array simultaneously in parallel and latches the read data and then time divides the latched data sequentially into multiple divided data to output consecutively the multiple time divided data. For example, where one page worth, 128 bits, of data is read out simultaneously in parallel and latched, the 128 bits of data is time divided into multiple 32-bit data, and these 32-bit data are output consecutively. Hence, in the page access mode, data can be read from the memory cell array at higher speed than in a normal random access mode.

SUMMARY OF THE INVENTION

The above access test is executed repeatedly each time under varied conditions of temperature, drive voltage, and the like, and hence there is the problem that an enormous amount of time is required for the access test. Even if data of a test pattern is read at high speed from a semiconductor memory device in the page access mode, the time required for the access test is not sufficiently reduced. The time required for the access test will be described below using a specific example.

FIG. 1 is a block diagram showing schematically the configuration of a nonvolatile semiconductor memory device 1 having an error correction function. The semiconductor memory device 1 comprises an address buffer 10 holding an N-bit input address signal Ain[N−1:0] (N−1 and 0 in the bracket correspond to MSB and LSB respectively). The address buffer 10 supplies a row address signal RA of the input address signal Ain[N−1:0] to a row decoder 11, a column address signal CA of the input address signal Ain[N−1:0] to a column decoder 12, and a page address signal PA of the input address signal Ain[N−1:0] to a selecting circuit 17.

A memory cell array 12 has multiple word lines $W_1, \ldots, W_K$ connected to the row decoder 11 and multiple bit lines $B_1, \ldots, B_L$ connected to the column decoder 13. Memory cells CL are respectively formed at places at which the word lines $W_1, \ldots, W_K$ and the bit lines $B_1, \ldots, B_L$ cross over. In the memory cell array 12, information bits and parity check bits of a test pattern for the access test are stored beforehand.

When reading data from the memory cell array 12, the row decoder 11 selectively activates one of the word lines $W_1$ to $W_K$ based on the row address signal RA, and the column decoder 13 selectively activates some of the bit lines $B_1$ to $B_L$ based on the column address signal CA. As a result, a current is read out from a memory cell CL connected to the activated word line $W_i$ through an activated bit line $B_j$. The read-out current is input to an amp circuit 14 via the column decoder 13. The amp circuit 14 produces P-bit data AO[P−1:0] and outputs to a latch circuit 15.

The latch circuit 15, holding the P-bit data AO[P−1:0], outputs the latched data LO[P−1:0] to an error correction circuit 16. The error correction circuit 16 performs error correction on the latched data LO[P−1:0] and outputs Q-bit error corrected data EO[Q−1:0]. The selecting circuit 17 has a function to select R-bit data SEL[R−1:0] from the error corrected data EO[Q−1:0] supplied from the error correction circuit 16 according to the page address signal PA. The selected data SEL[R−1:0] is supplied to a pad circuit 19 via an output buffer circuit 18.

FIG. 2 illustrates schematically a timing chart when reading data in the page access mode. In the timing chart of FIG. 2, the low order two bits Ain[1:0] of the input address signal Ain[N−1:0] are assigned as the page address signal PA. In FIG. 2, decimal values "1", "2", "3", "4" corresponding to the two-bit values "00", "01", "10", "11" of the page address signal Ain[1:0] are shown. In selecting memory cells, the N−2 high order bits Ain[N−1:2] of the input address signal Ain[N−1:0] are used.

Referring to FIG. 2, at time $t_1$, the value of the input address signal Ain[N−1:0] changes. Upon this time, the row decoder 11 activates one of the word lines $W_1$ to $W_K$ based on the row address signal RA of the address signal Ain[N−1:2]. At the same time, the column decoder 13 simultaneously activates P bit lines of the bit lines $B_1$ to $B_L$ based on the column address signal CA of the address signal Ain[N−1:2]. As a result, currents are read out simultaneously in parallel from P memory cells CL through the activated P bit lines. Thus the amp circuit 14 outputs P-bit data AO[P−1:0] at time $t_2$. The latch circuit 15 outputs P-bit latched data LO[P−1:0] at time $t_3$. Thereafter the error correction circuit 16 outputs error corrected data EO[Q−1:0] at time $t_4$.

As shown in FIG. 3, the selecting circuit 17 has multiplexers $17_1$ to $17_R$. Each of the multiplexers $17_1$ to $17_R$ selects one of four bits of the output data EO[Q−1:0] of the error correction circuit 16 according to the value (=1 to 4) of the page address signal Ain[1:0] and gives the selected bit to the output buffer circuit 18. Hence, the multiplexers $17_1$ to $17_R$ time divide the output data EO[Q−1:0] of the error correction circuit 16 sequentially into four data signals $SEL_1$ to $SEL_4$ to consecutively output these four data signals $SEL_1$ to $SEL_4$ to the output buffer circuit 18. That is, as shown in FIG. 2, when the value of the page address signal Ain[1:0] is at 1, the first data signal $SEL_1$ is output at time $t_5$. After the value of the page address signal Ain[1:0] changes to 2 at time $t_7$, the second data signal $SEL_2$ is output at time $t_8$. After the value of the page address signal Ain[1:0] changes to 3 at time $t_{10}$, the third data signal $SEL_3$ is output at time $t_{11}$. Then, after the value of the page address signal Ain[1:0] changes to 4 at time $t_{13}$, the second data signal $SEL_4$ is output at time $t_{14}$. The output buffer circuit 18 outputs data DO[R−1:0] delayed relative to the output data SEL[R−1:0] of the selecting circuit 17 at times $t_6$, $t_9$, $t_{12}$, $t_{15}$.

Assume that the time from time $t_1$ to time $t_6$ is 100 nanoseconds and that the time from time $t_7$ to time $t_9$ is 30 nanoseconds. Then it takes at least 190 nsec (=100 nsec+30 nsec× 3) to read and verify the first to fourth data signals $SEL_1$ to $SEL_4$.

Meanwhile, when operating in a random access mode, a nonvolatile semiconductor memory device is required to allow data read from any memory cells at constant access speed. Accordingly, it is required to test the memory device on whether the values of the output data DO[R−1:0] match expected values and whether access speed is appropriate when changing the value of the address signal Ain[N−1:2] at a constant cycle.

FIG. 4 shows schematically a timing chart when reading data in the random access mode. In the timing chart of FIG. 4, the pattern of the address signal Ain[N−1:2] changes from pattern 1 (from time $t_1$ to time $t_7$) to pattern 2 (from time $t_7$ to time $t_{13}$) to pattern 1 (from time $t_{13}$ to time $t_{19}$). Also, the page address signal Ain[1:0] changes from "1" (from time $t_1$ to time $t_7$) to "2" (from time $t_7$ to time $t_{13}$) to "3" (from time $t_{13}$ to time $t_{19}$).

As shown in FIG. 4, when the page address signal Ain[1:0] is at 1, the circuits 14 to 18 start to output data AO[P−1:0], LO[P−1:0], EO[P−1:0], SEL[Q−1:0], and DO[Q−1:0] between time $t_2$ and time $t_6$. When the page address signal Ain[1:0] is at 2, the circuits 14 to 18 start to output data AO[P−1:0], LO[P−1:0], EO[P−1:0], SEL[Q−1:0], and DO[Q−1:0] between time $t_8$ and time $t_{12}$. When the page address signal Ain[1:0] is at 3, the circuits 14 to 18 start to output data AO[P−1:0], LO[P−1:0], EO[P−1:0], SEL[Q−1: 0], and DO[Q−1:0] between time $t_{14}$ and time $t_{18}$.

Thus, in the random access mode if the value of the address signal Ain[N−1:2] changes at a cycle of 100 nsec, it takes at least 400 nsec (=100 nsec×4) to read and verify one page worth of data.

In view of the above background, an object of the present invention is to provide a semiconductor memory device which enables a reduction in the time required for the access test.

In order to achieve the above object, according to the present invention, there is provided a semiconductor memory device which stores predetermined code words each composed of information bits and parity check bits, which comprises a memory cell array having a plurality of word lines and a plurality of bit lines and having a plurality of memory cells respectively formed at places at which the word lines and the bit lines cross over, the memory cells being arranged in a matrix; a row decoder to select one of the word lines based on a row address signal; a column decoder to select some of the bit lines based on a column address signal; an error correction circuit to perform error correction on a code word read through the bit lines selected by the column decoder from ones of the memory cells located at places at which the word line selected by the row decoder and the selected bit lines cross over, thereby detecting an error position in the code word to generate error detection data indicating the error position, and to correct the information bit in the detected error position to generate error corrected data; and an output circuit to receive the error detection data and the error corrected data from the error correction circuit. The output circuit relays the error corrected data to the outside when a normal operation mode has been designated and relays the error detection data to the outside when a test operation mode has been designated.

The semiconductor memory device has the output circuit that relays the error detection data to the outside when the test operation mode has been designated. Hence, because the error detection data can be analyzed, the time required for the access test can be greatly reduced.

DETAILED DESCRIPTION OF THE PREFERRED EMBODIMENTS

Embodiments according to the present invention will be described below.

First Embodiment

Figure 1:
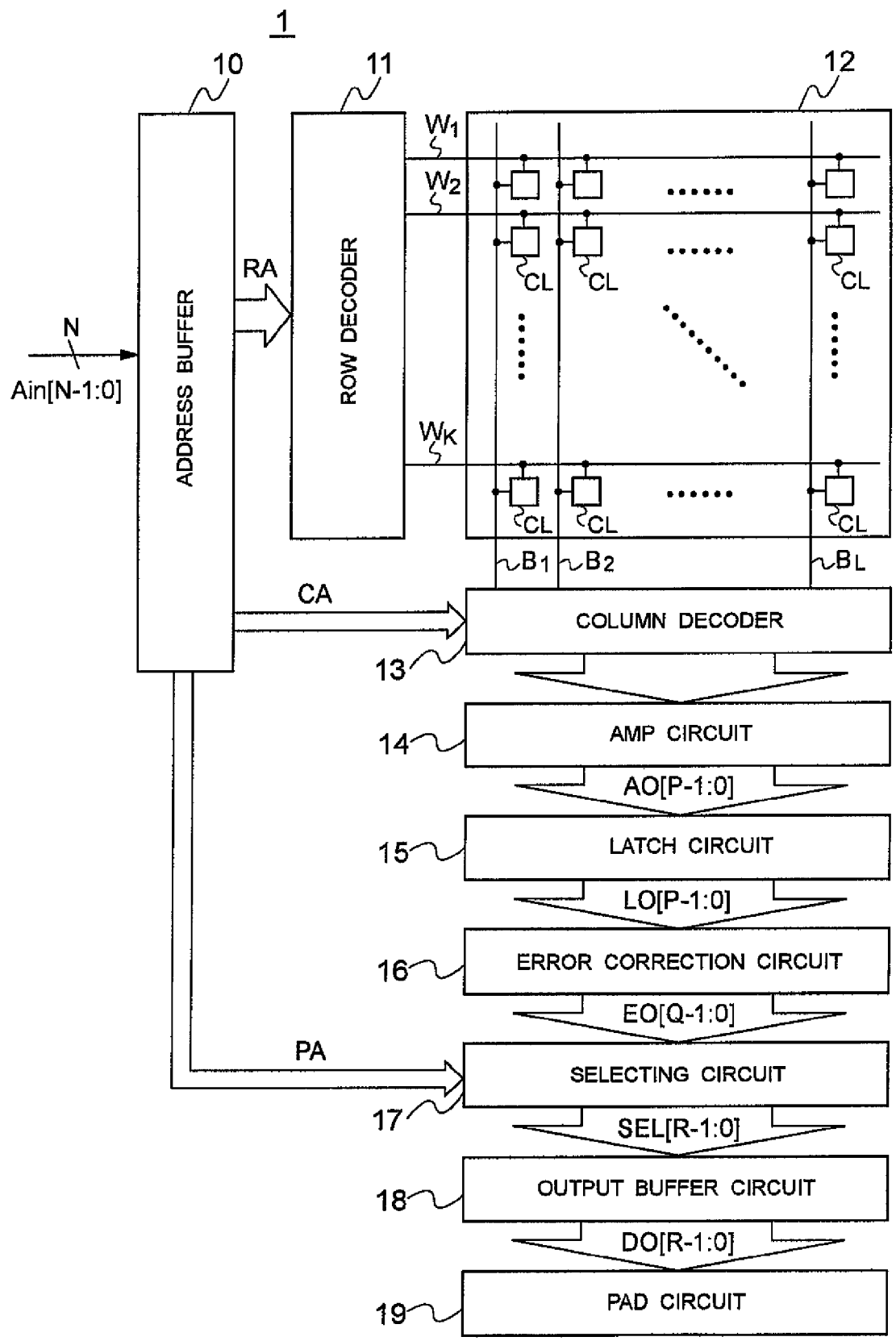
FIG. 1 is a block diagram showing schematically the configuration of a nonvolatile semiconductor memory device having an error correction function.
Figure 2:
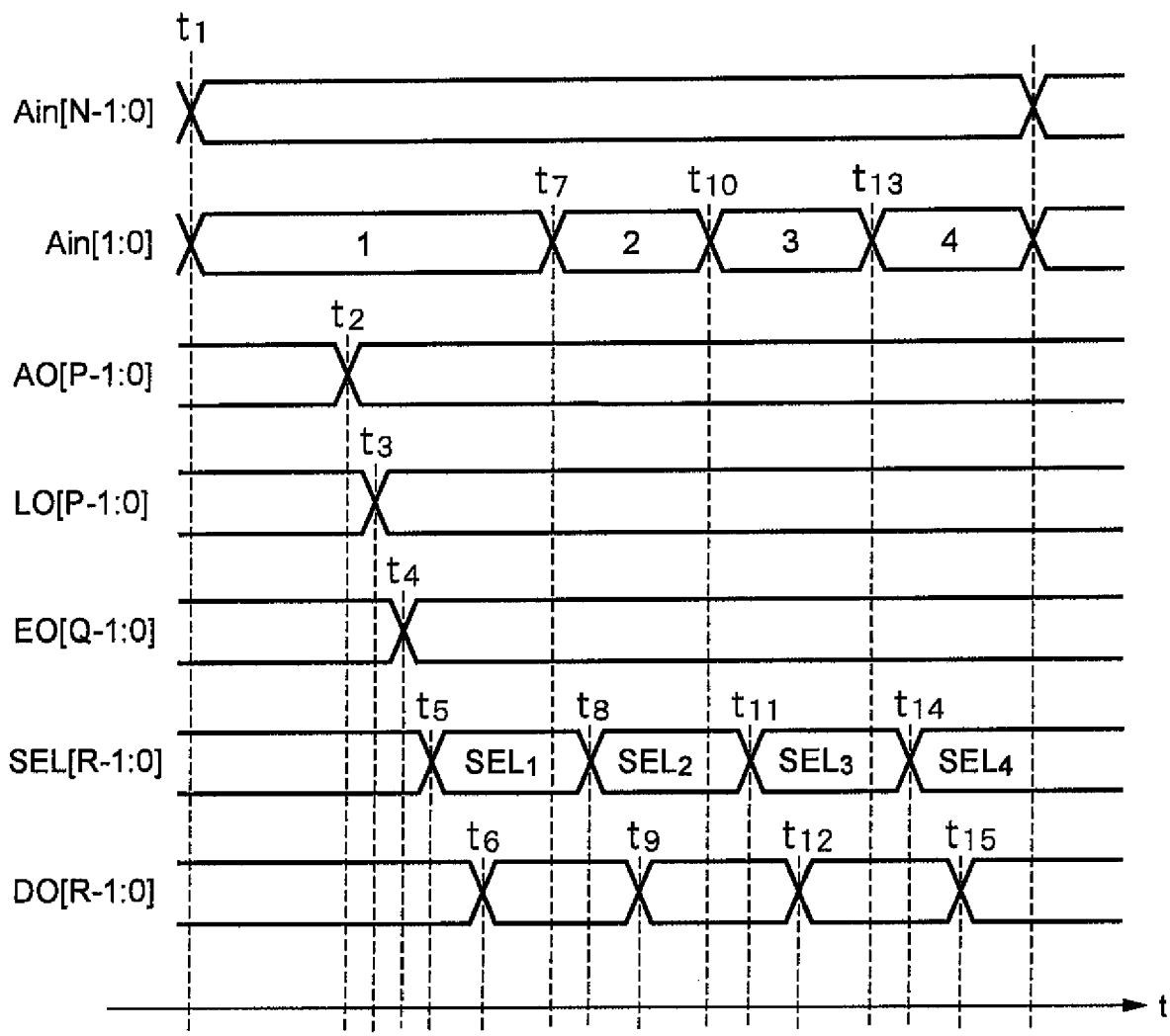
FIG. 2 illustrates schematically a timing chart when reading data in a page access mode.
Figure 3:
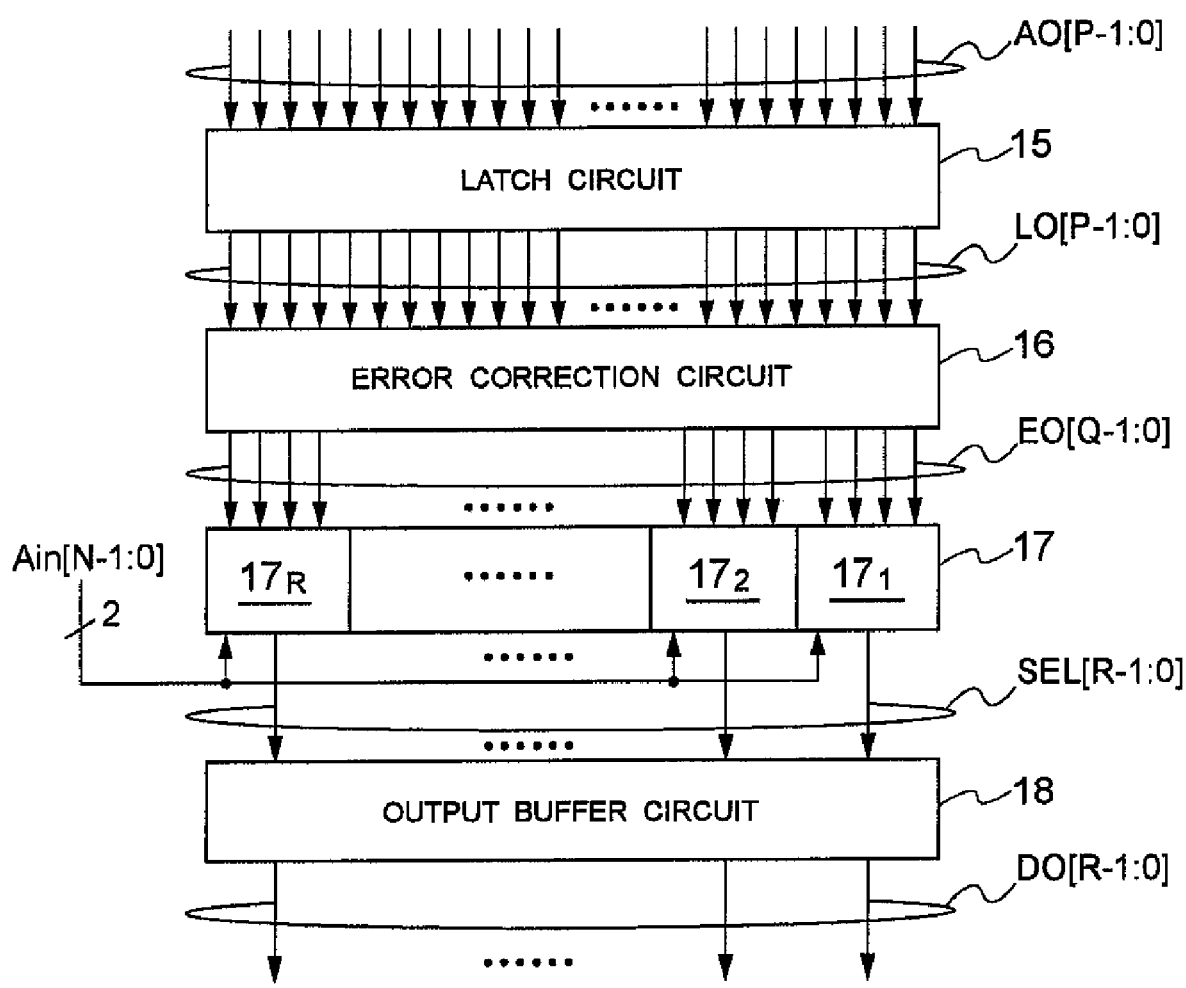
FIG. 3 is a diagram showing schematically the configuration of a selecting circuit.
Figure 4:
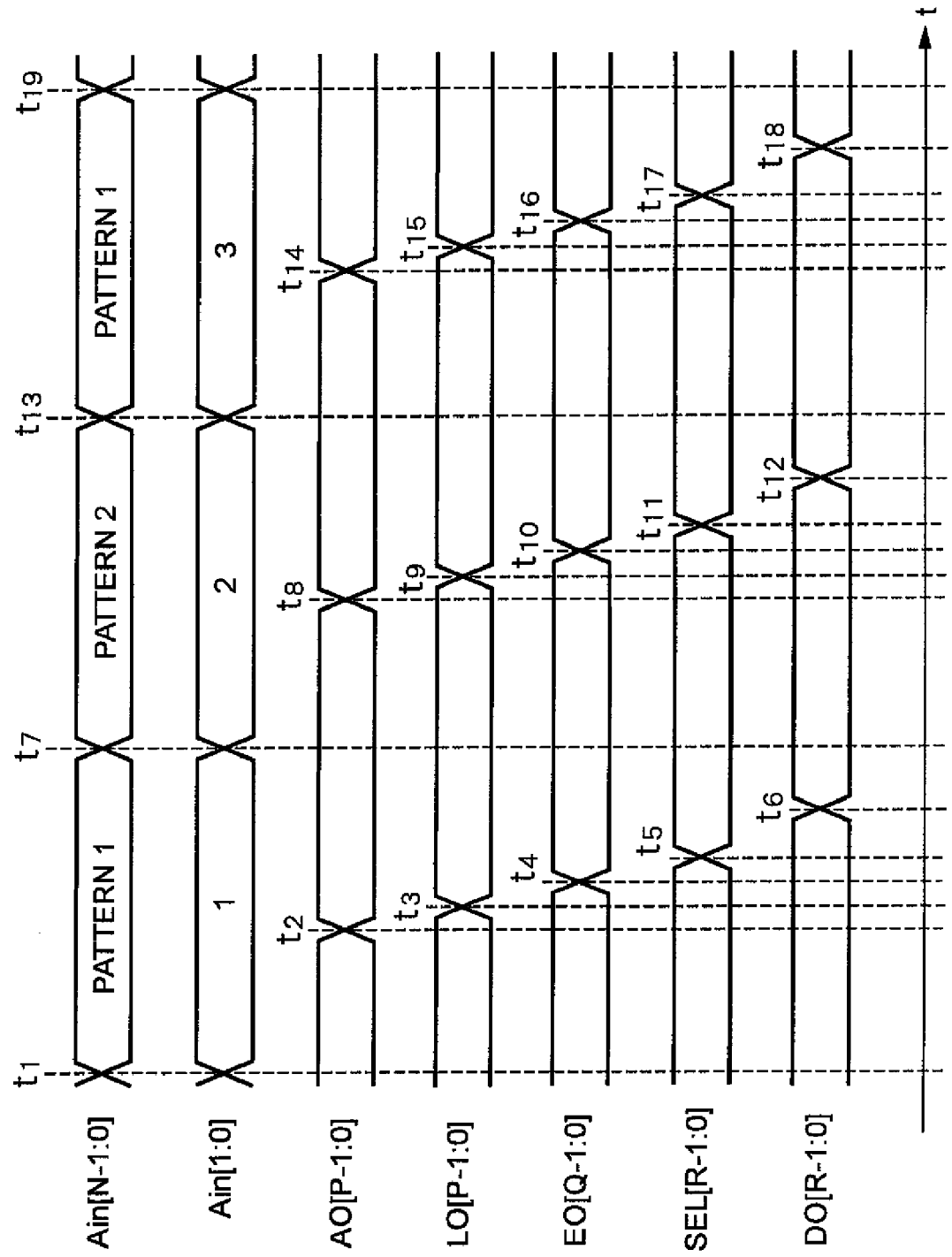
FIG. 4 shows schematically a timing chart when reading data in a random access mode.
Figure 5:
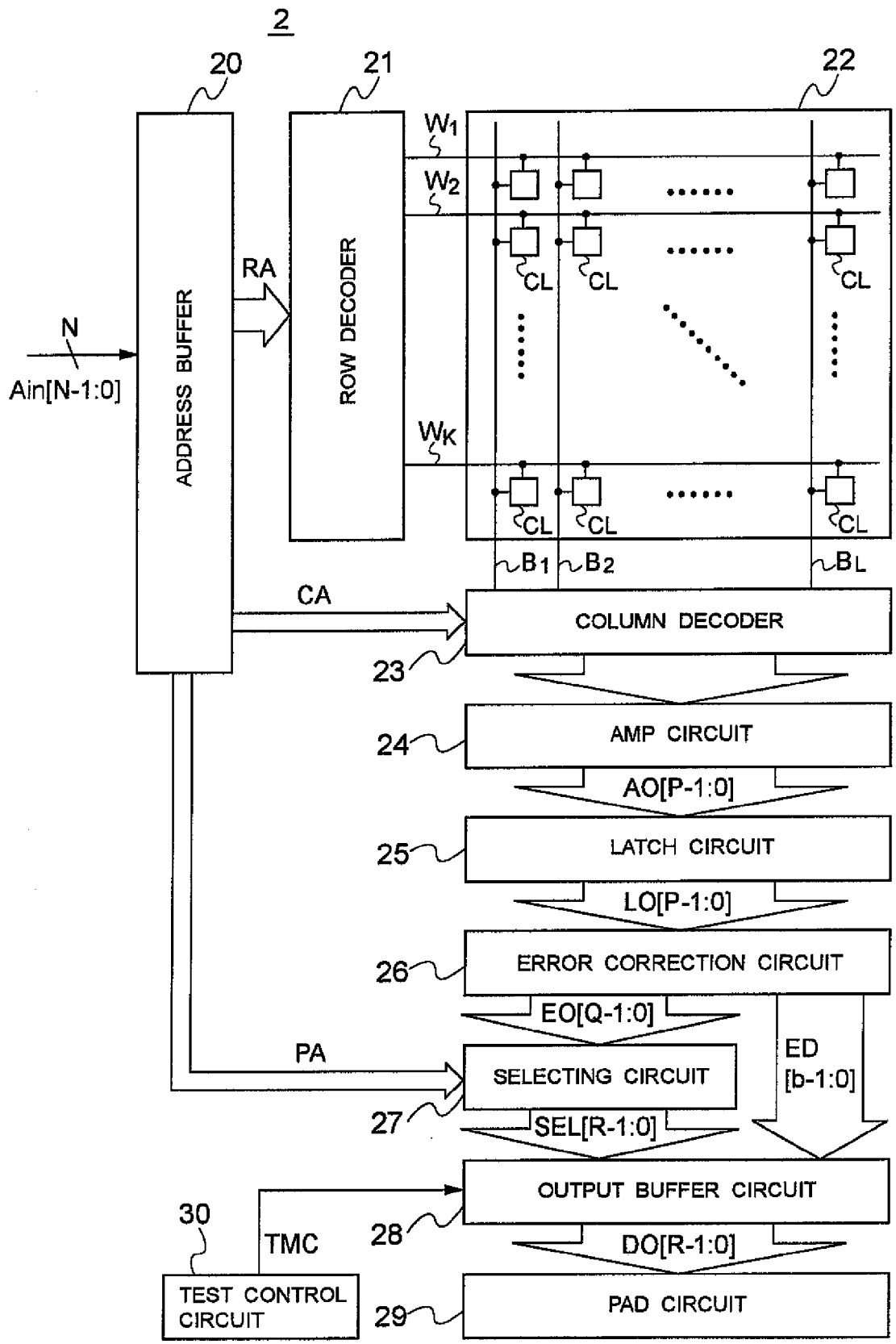
FIG. 5 is a block diagram showing schematically the configuration of a nonvolatile semiconductor memory device of a first embodiment of the present invention.

FIG. 5 is a block diagram showing schematically the configuration of a nonvolatile semiconductor memory device 2 of a first embodiment of the present invention. The semiconductor memory device 2 comprises an address buffer 20, a row decoder 21, a memory cell array 22, a column decoder 23, an amp circuit 24, a latch circuit 25, an error correction circuit 26, a selecting circuit 27, an output buffer circuit 28, a pad circuit 29, and a test control circuit 30. An output circuit according to the present invention corresponds to the selecting circuit 27 and the output buffer circuit 28.

The address buffer 20 holds an input address signal Ain[N−1:0] supplied from an external controller (not shown) and supplies a row address signal RA of the input address signal Ain[N−1:0] to the row decoder 21, a column address signal CA of the input address signal Ain[N−1:0] to the column decoder 23, and a page address signal PA of the input address signal Ain[N−1:0] to the selecting circuit 27.

The memory cell array 22 has multiple word lines $W_1, \ldots, W_K$ connected to the row decoder 21 and multiple bit lines $B_1, \ldots, B_L$ connected to the column decoder 23. Memory cells CL are respectively formed at places at which the word lines $W_1, \ldots, W_K$ and the bit lines $B_1, \ldots, B_L$ cross over. In the memory cell array 22, known test pattern data for the access test is stored, and this test pattern data is constituted by code words each composed of information bits and parity check bits.

When reading data from the memory cell array 22, the row decoder 21 selectively activates one of the word lines $W_1$ to $W_K$ based on the row address signal RA, and the column decoder 23 selectively activates some of the bit lines $B_1$ to $B_L$ based on the column address signal CA. As a result, a current is read out from a memory cell CL connected to the activated word line $W_i$ through an activated bit line $B_j$. The read-out current is input to the amp circuit 24 via the column decoder 23. The amp circuit 24 produces P-bit data AO[P−1:0] based on the read-out currents and outputs to the latch circuit 25. The latch circuit 25, holding the P-bit data AO[P−1:0], outputs the latched data LO[P−1:0] to the error correction circuit 26. The error correction circuit 26 performs error correction on the latched data LO[P−1:0] to produce error corrected data EO[Q−1:0].

Figure 6:
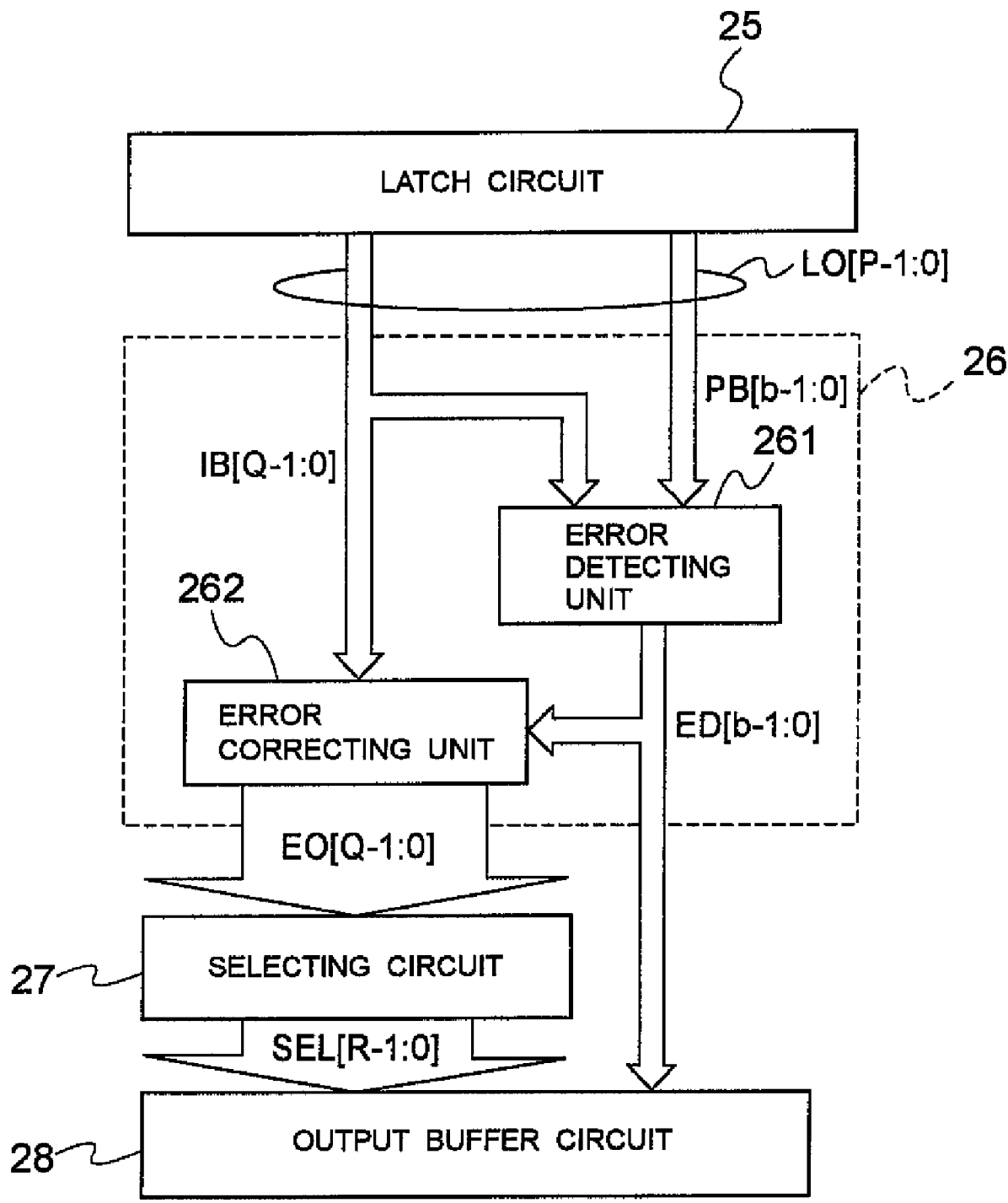
FIG. 6 is a block diagram showing schematically the configuration of an error correction circuit.

FIG. 6 is a block diagram showing schematically the configuration of the error correction circuit 26. As shown in FIG. 6, the error correction circuit 26 comprises an error detecting unit 261 and an error correcting unit 262. The latched data LO[P−1:0] supplied from the latch circuit 25 is constituted by a code word composed of information bits IB[Q−1:0] and parity check bits PB[b−1:0]. The error detecting unit 261 has a function to detect an error position in the code word that is the latched data LO[P−1:0] and give b-bit error detection data ED[b−1:0] indicating the error position to the error correcting unit 262. The error correcting unit 262 corrects the error in the information bits IB[Q−1:0] based on the error detection data ED[b−1:0] to produce Q-bit error corrected data EO[Q−1:0]. If no error exists in the code word, all bits of the error detection data ED[b−1:0] is at 0, and if an error exists in the code word, the bit of the error detection data ED[b−1:0] corresponding to the error position becomes 1. Although the error correction circuit 26 uses the well-known Hamming system as the error correcting system, the present invention is not limited to this.

As shown in FIG. 5, the error corrected data EO[Q−1:0] is output to the selecting circuit 27, and at the same time the error detection data ED[b−1:0] is output to the output buffer circuit 28. The selecting circuit 27 selects R-bit data SEL[R−1:0] of the Q-bit error corrected data EO[Q−1:0] supplied from the error correction circuit 26 according to the page address signal PA and outputs the selected data SEL[R−1:0].

Figure 7:
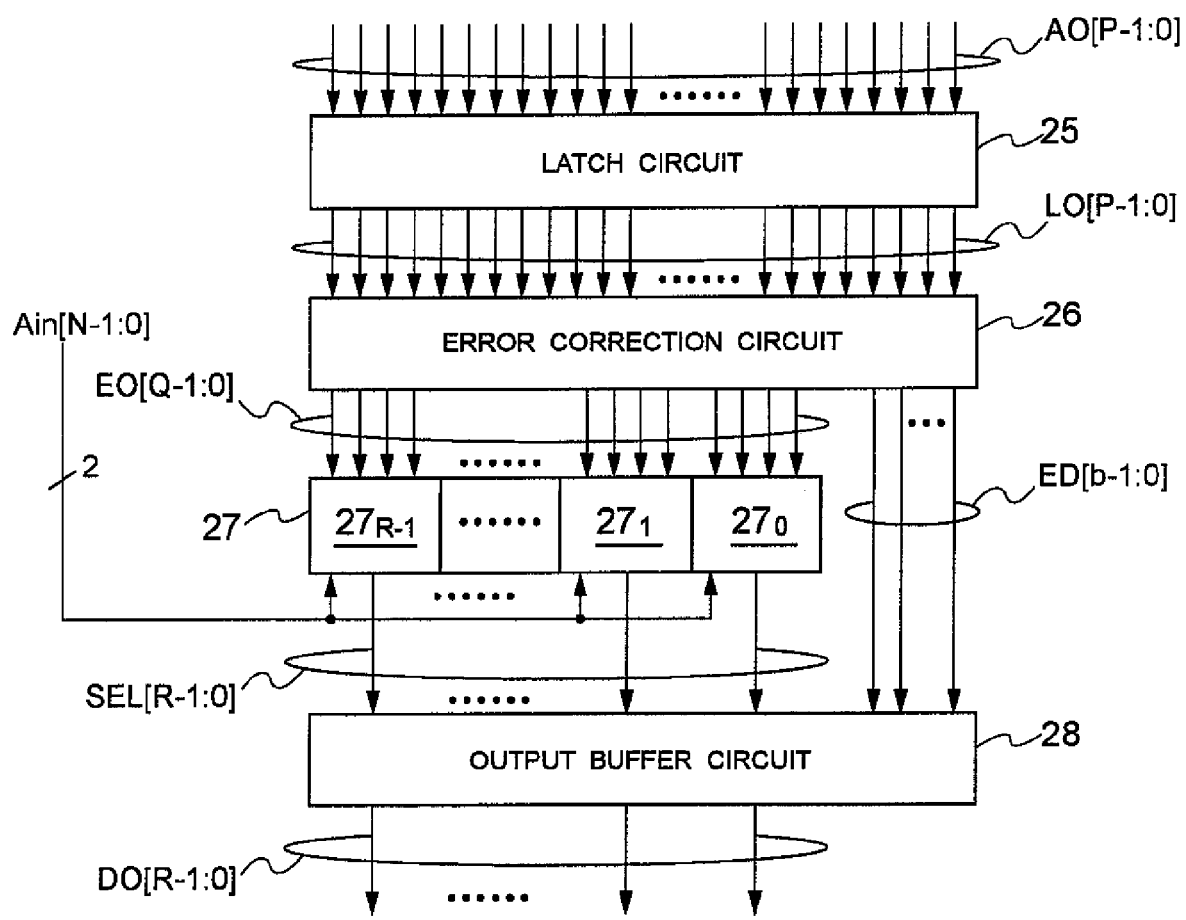
FIG. 7 is a diagram showing schematically the configuration of a selecting circuit.

In the case where a 2-bit page address signal Ain[1:0] (=PA) is used, as shown in FIG. 7, the selecting circuit 27 has R multiplexers $27_0$ to $27_{R-1}$. Each multiplexer $27_i$, where i=0 to R−1, selects one of four bits supplied from the error correction circuit 26 according to the page address signal Ain[1:0] and outputs the selected bit SEL[i]. Note that the number of signal inputs of the multiplexer $27_i$ is not limited to four but may be 8 or 16. Also, the number of bits of the page address signal PA is not limited to two but may be three or four depending on the number of signal inputs of the multiplexer $27_i$.

Figure 8:
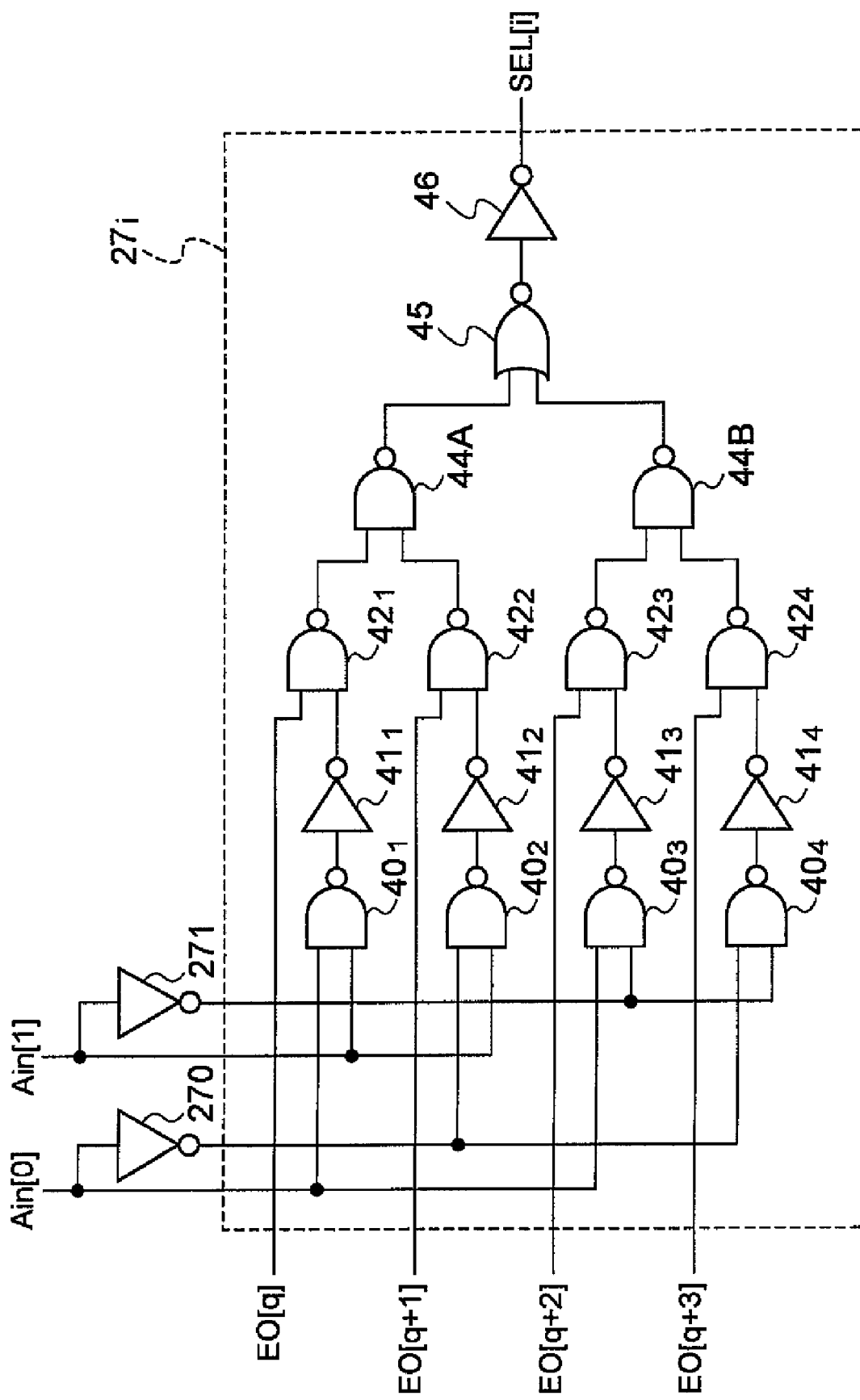
FIG. 8 shows the circuit configuration of a multiplexer forming part of the selecting circuit.

FIG. 8 shows an example of the circuit configuration of the multiplexer $27_i$. As shown in FIG. 8, the least significant bit ($0^{th}$ bit) Ain[0] and the first bit Ain[1] of the page address signal Ain[1:0] are supplied to the multiplexer $27_i$. At the same time the multiplexer $27_i$ is supplied with an inverted bit of the least significant bit Ain[0] from a first inverter 270 and with an inverted bit of the first bit Ain[1] from a second inverter 271. As shown in FIG. 8, the multiplexer $27_i$ comprises a first group of NAND gates $40_1, 40_2, 40_3, 40_4$, inverters $41_1, 41_2, 41_3, 41_4$, a second group of NAND gates $42_1, 42_2, 42_3, 42_4$, a third group of NAND gates 44A, 44B, a NOR gate 45, and an inverter 46. For example, when the least significant bit Ain[0] and the first bit Ain[1] are both 0, the outputs of the inverters $41_1, 41_2, 41_3$ become 0, and the output of the inverter $41_4$ becomes 1. At this time the outputs of the NAND gates $42_1, 42_2, 42_3$ are held at 1. Thus, the (q+3)th bit EO[q+3] from among the qth bit EO[q] to the (q+3)th bit EO[q+3] in the error corrected data EO[Q−1:0] is selected, and the bit EO[q+3] is output as the selected bit SEL[i].

The semiconductor memory device 2 of the present embodiment has a normal operation mode and a test operation mode. The test control circuit 30 of FIG. 5 generates a test control signal TCM of a high level (H level) when the test operation mode is designated and the test control signal TCM of a low level (L level) when the normal operation mode is designated. When the test control signal TCM is at the L level indicating the normal operation mode, the output buffer circuit 28 relays the selected data SEL[R−1:0] supplied from the selecting circuit 27 to the pad circuit 29. In contrast, when the test control signal TCM is at the H level indicating the test operation mode, the output buffer circuit 28 relays the error detection data ED[b−1:0] instead of all or some bits of the selected data SEL[R−1:0] supplied from the selecting circuit 27 to the pad circuit 29. Hence the error detection data ED[b−1:0] can be supplied via the pad circuit 29 onto external connection terminals (not shown).

Figure 9:
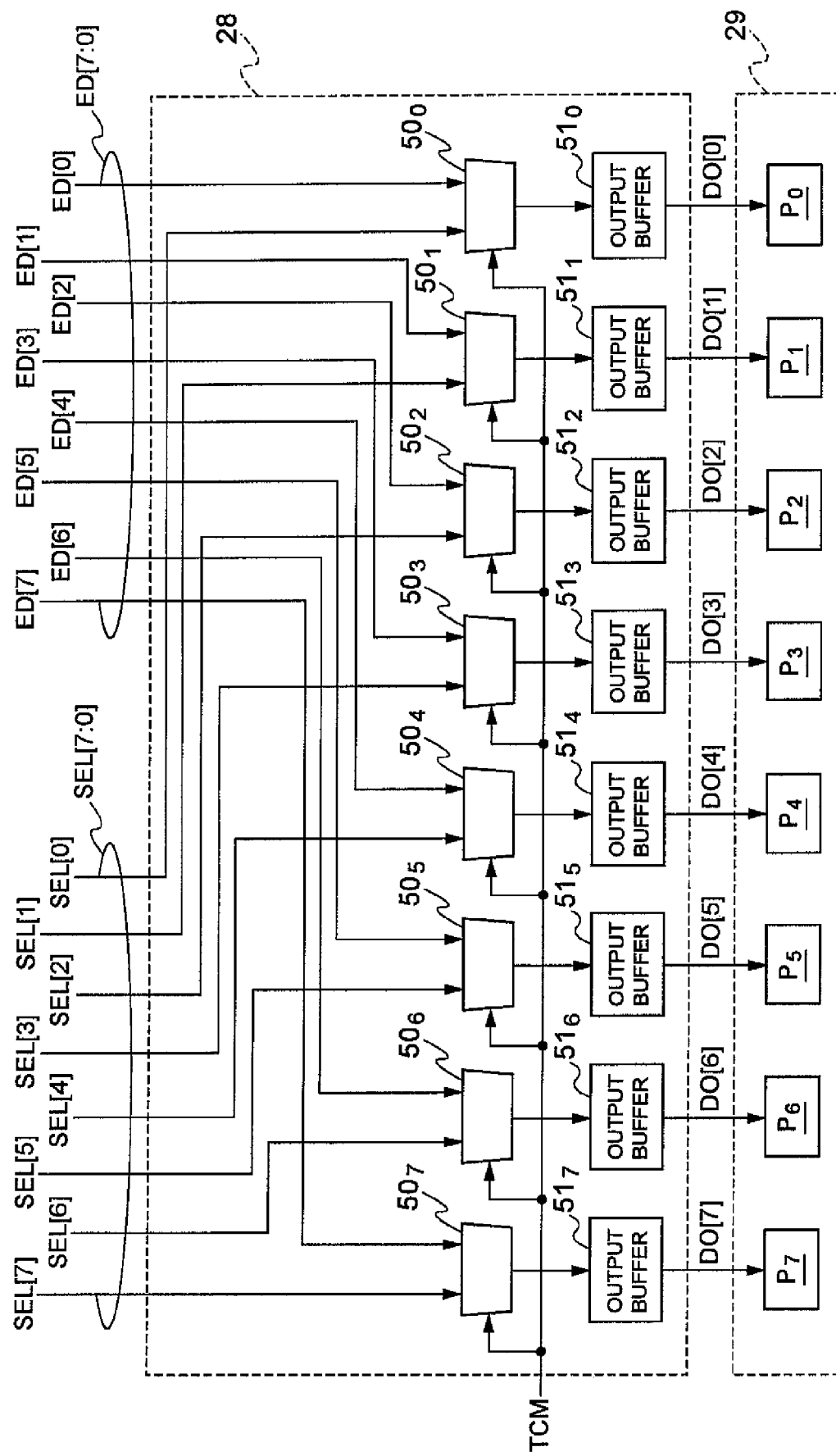
FIG. 9 shows an example configuration of an output buffer circuit.
Figure 10:
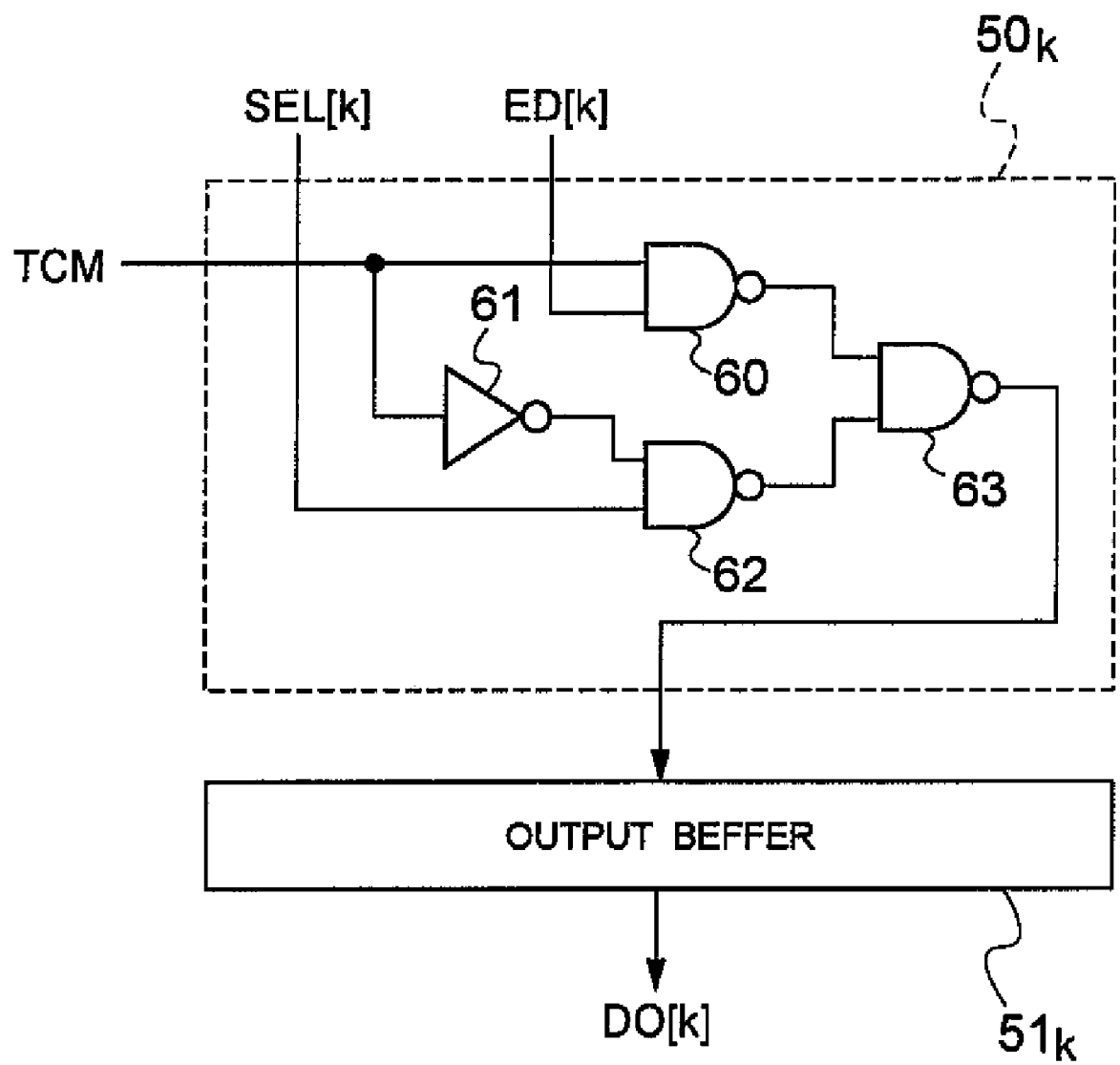
FIG. 10 shows an example configuration of a selector.

FIG. 9 shows an example configuration of the output buffer circuit 28 in the case where 8-bit selected data SEL[7:0] and 8-bit error detection data ED[7:0] are generated. The output buffer circuit 28 of FIG. 9 comprises multiple selectors $50_0$ to $50_7$ and output buffers $51_0$ to $51_7$ connected to these selectors $50_0$ to $50_7$ respectively. Bit outputs DO[0] to DO[7] of the output buffers $51_0$ to $51_7$ are supplied onto pads $P_0$ to $P_7$ forming the pad circuit 29. FIG. 10 shows an example configuration of the kth selector $50_k$. The selectors $50_k$ of FIG. 10 comprises three NAND gates 60, 62, 63 and an inverter 61. When the test control signal TCM is at 0, this selector $50_k$ selects the kth bit SEL[k] of the selected data SEL[7:0] and supplies the selected bit SEL[k] to the output buffer $51_k$. In contrast, when the test control signal TCM is at 1, this selector $50_k$ selects the kth bit ED[k] of the error detection data ED[7:0] and supplies the selected bit ED[k] to the output buffer $51_k$.

Figure 11:
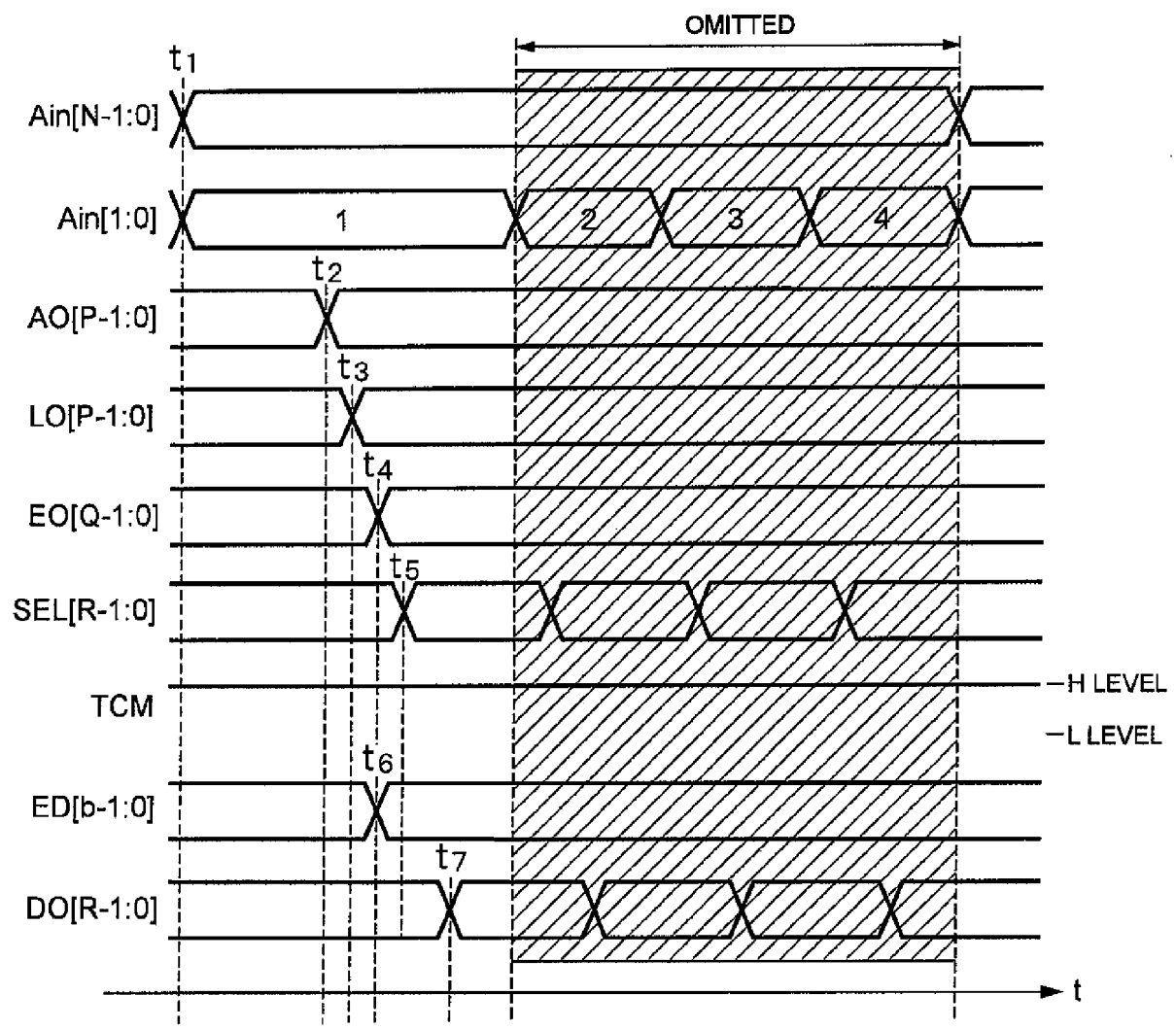
FIG. 11 illustrates schematically a timing chart when reading data in the page access mode in the case where a test operation mode has been designated.

FIG. 11 illustrates schematically a timing chart when reading data in the page access mode in the case where the test operation mode has been designated. In the timing chart of FIG. 11, the low order two bits Ain[1:0] of the input address signal Ain[N−1:0] are assigned as the page address signal PA. In FIG. 11, decimal values "1", "2", "3", "4" corresponding to the two-bit values "00", "01", "10", "11" of the page address signal Ain[1:0] are shown. In selecting memory cells, the N−2 high order bits Ain[N−1:2] of the input address signal Ain[N−1:0] are used.

Referring to FIG. 11, at time $t_1$, the value of the input address signal Ain[N−1:0] changes. Upon this time, the row decoder 21 activates one of the word lines $W_1$ to $W_K$ based on the row address signal RA of the address signal Ain[N−1:2]. At the same time, the column decoder 23 simultaneously activates P bit lines of the bit lines $B_1$ to $B_L$ based on the column address signal CA of the address signal Ain[N−1:2]. As a result, currents are read out simultaneously in parallel from P memory cells CL through the activated P bit lines. Thus the amp circuit 24 outputs P-bit data AO[P−1:0] at time $t_2$. The latch circuit 25 outputs P-bit latched data LO[P−1:0] at time $t_3$. Thereafter the error correction circuit 26 outputs error corrected data EO[Q−1:0] at time $t_4$. Then the selecting circuit 27 outputs selected data SEL[R−1:0] to the output buffer circuit 28 at time $t_5$.

The error correction circuit 26 outputs the error corrected data EO[Q−1:0] and error detection data ED[b−1:0] for all bits of the latched data LO[P−1:0] to the output buffer circuit 28 at time $t_6$. When the test control signal TCM is at the H level indicating the test operation mode, the output buffer circuit 28 supplies the error detection data ED[b−1:0] via the pad circuit 29 onto external connection terminals at time $t_7$. Thus, when the page address signal Ain[1:0] is at 1, the error detection data ED[b−1:0] for all bits of the latched data LO[P−1:0] can be output to the outside, and the access test can be carried out using the error detection data ED[b−1:0]. Hence the period where the page address signal Ain[1:0] cycles through values of 2 to 4 can be omitted (Jumped over), and thus the time required for the access test can be greatly reduced.

Figure 12:
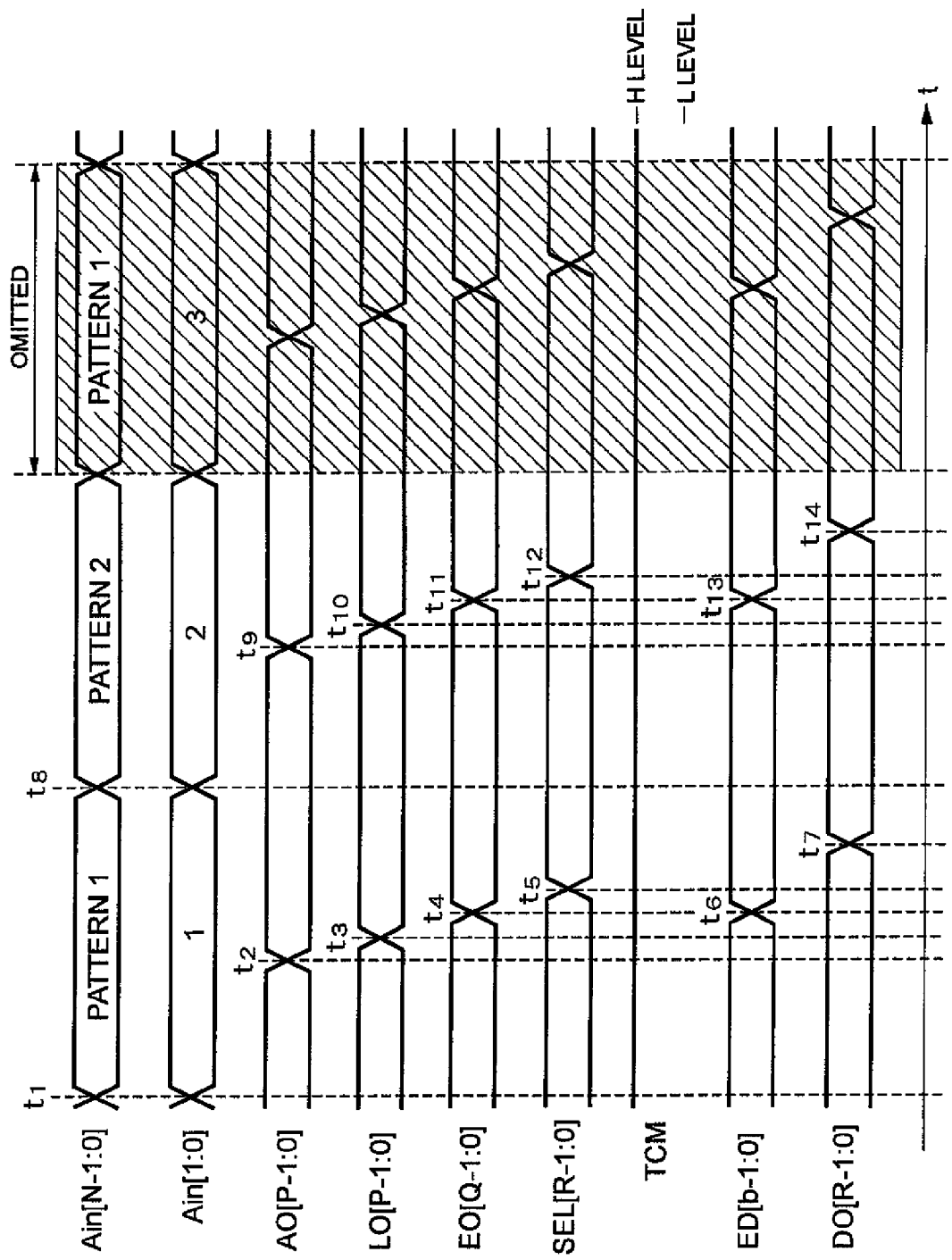
FIG. 12 illustrates a timing chart when reading data in the random access mode in the case where the test operation mode has been designated.

FIG. 12 illustrates a timing chart when reading data in the random access mode in the case where the test operation mode has been designated. In the timing chart of FIG. 12, the pattern of the address signal Ain[N−1:2] changes from pattern 1 (from time $t_1$ to time $t_7$) to pattern 2 (from time $t_7$ to time $t_{13}$) to pattern 1 (from time $t_{13}$ to time $t_{19}$). Also, the page address signal Ain[1:0] changes from "1" (from time $t_1$ to time $t_7$) to "2" (from time $t_7$ to time $t_{13}$) to "3" (from time $t_{13}$ to time $t_{19}$).

As shown in FIG. 12, when the page address signal Ain[1:0] is at 1, the circuits 24 to 28 start to output data AO[P−1:0], LO[P−1:0], EO[P−1:0], SEL[Q−1:0], ED[b−1:0], and DO[Q−1:0] between time $t_2$ and time $t_7$. Here the output buffer circuit 28 outputs the error detection data ED[b−1:0] for all bits of the latched data LO[P−1:0] read from the memory cells CL corresponding to pattern 1 of the address signal Ain[N−1:2] onto external connection terminals.

Next, when the page address signal Ain[1:0] is at 2, the circuits 24 to 28 start to output data AO[P−1:0], LO[P−1:0], EO[P−1:0], SEL[Q−1:0], ED[b−1:0], and DO[Q−1:0] between time $t_9$ and time $t_{14}$. Here the output buffer circuit 28 outputs the error detection data ED[b−1:0] for all bits of the latched data LO[P−1:0] read from the memory cells CL corresponding to pattern 2 of the address signal Ain[N−1:2] onto the external connection terminals.

Then, when the page address signal Ain[1:0] is at 3, the output buffer circuit 28 outputs the error detection data ED[b−1:0] for all bits of the latched data LO[P−1:0] read from the memory cells CL corresponding to pattern 1 of the address signal Ain[N−1:2] to the outside, but the same data as this error detection data ED[b−1:0] is already output to the outside at time $t_6$. Hence the period where the page address signal Ain[1:0] cycles through a value of 3 can be omitted (jumped over), and thus the time required for the access test can be reduced.

As described above, because the semiconductor memory device 2 of the first embodiment has the test operation mode, the access test can be carried out in a short time. Moreover, an external test apparatus can easily find out a fully operable bit ratio and relieved bits of the memory cells CL in the memory cell array 22 from the error detection data ED[b−1:0] obtained in the test operation mode. By analyzing the error detection data ED[b−1:0] according to the Hamming system, an error in the latched data LO[P−1:0] input to the error correction circuit 26 can be accurately found, if any, and thus the mapping of failed memory cells CL can be carried out in a short time.

Figure 13:
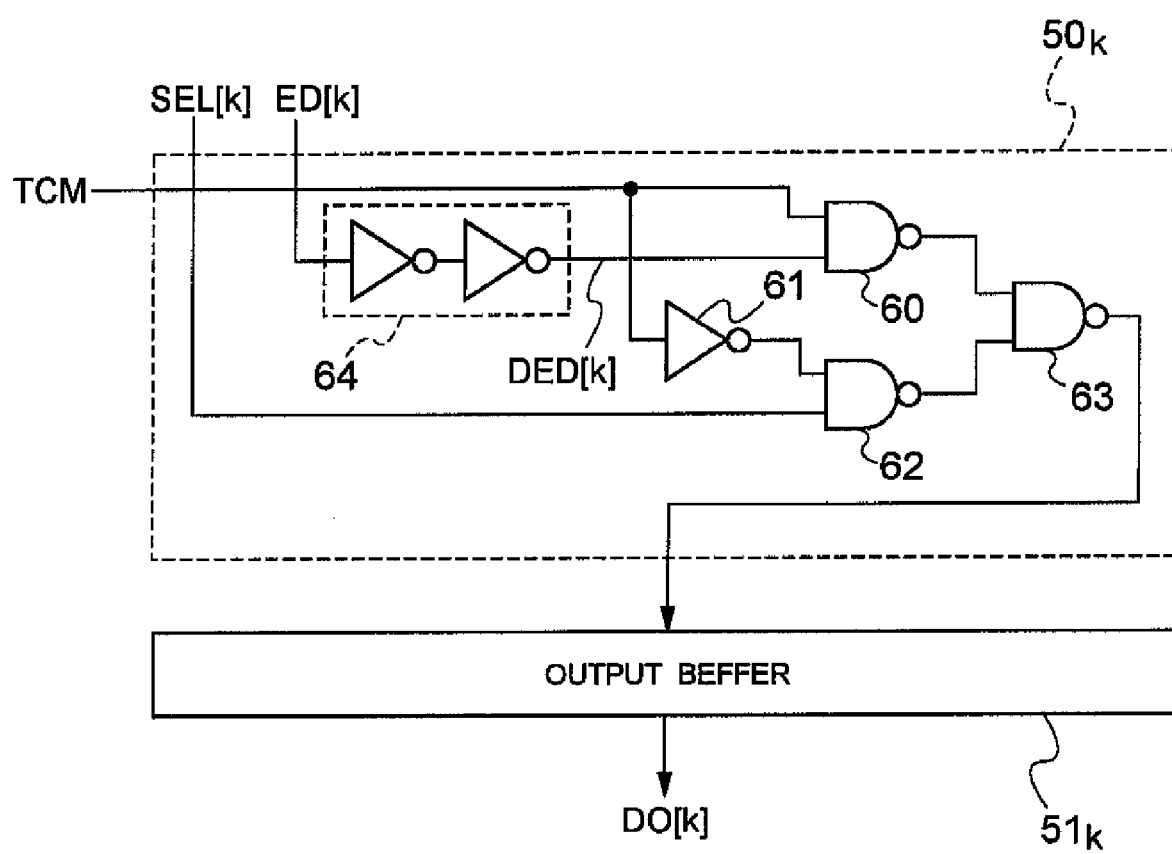
FIG. 13 shows a modified example of the selector.
Figure 14:
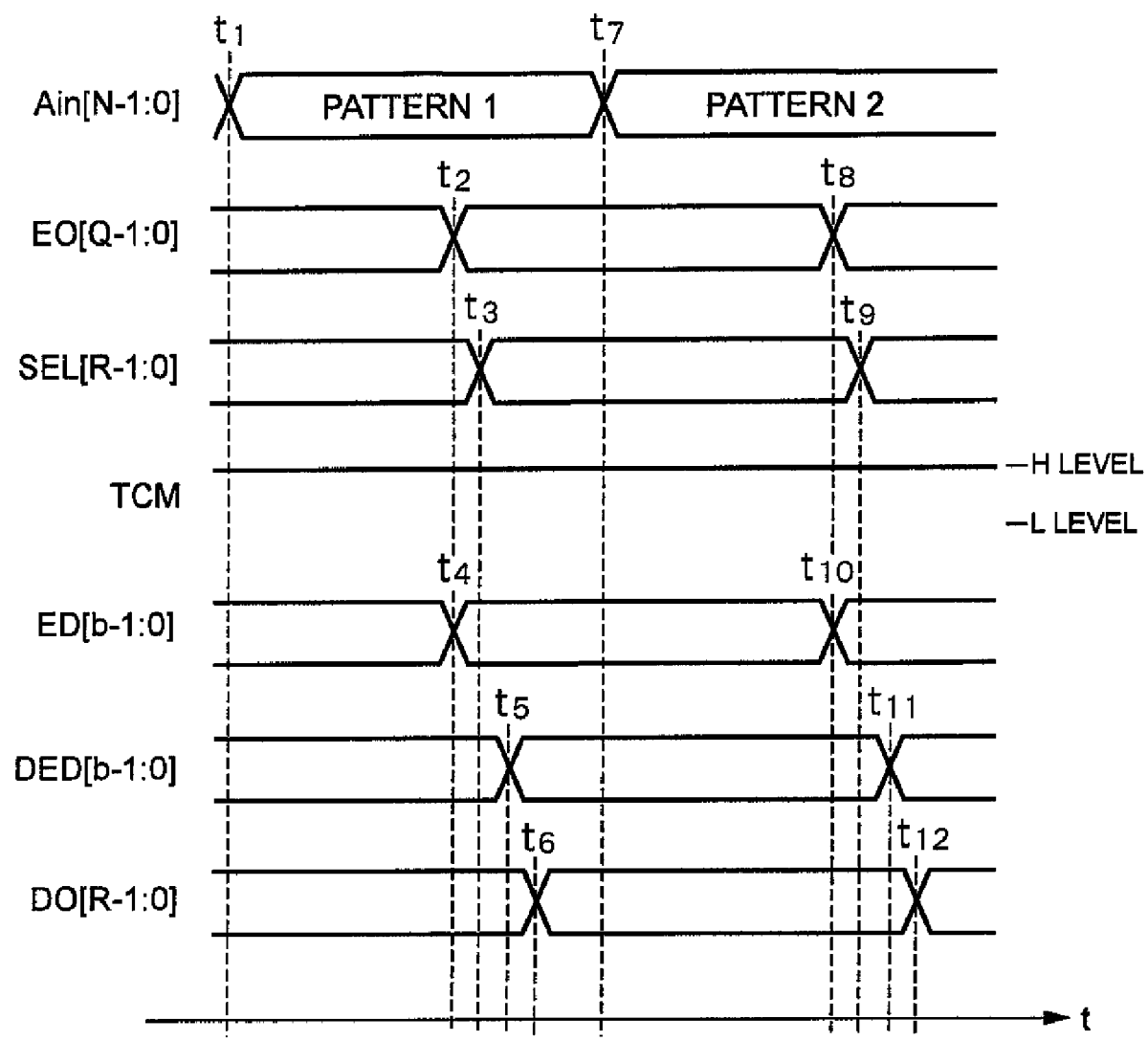
FIG. 14 illustrates a timing chart when reading data in the random access mode in the case where the test operation mode has been designated.

If the transmission of the error detection data ED[b−1:0] is earlier than that of the selected data SEL[R−1:0] as shown in FIG. 12, the access test may not produce stable results. Accordingly, the output buffer circuit 28 desirably has delay elements for delaying the error detection data ED[b−1:0] transmitted from the error correction circuit 26. To be specific, each selector $50_k$ of FIG. 9 may have a delay element 64 as shown in FIG. 13. This delay element 64 delays the signal of the kth bit of the error detection data ED[b−1:0] into a delayed bit signal DED[k]. By this means, the delayed error detection data DED[b−1:0] is later in transmission than the selected data SEL[R−1:0] as shown in the timing chart of FIG. 14, and thus the access test produces stable results.

Second Embodiment

Figure 15:
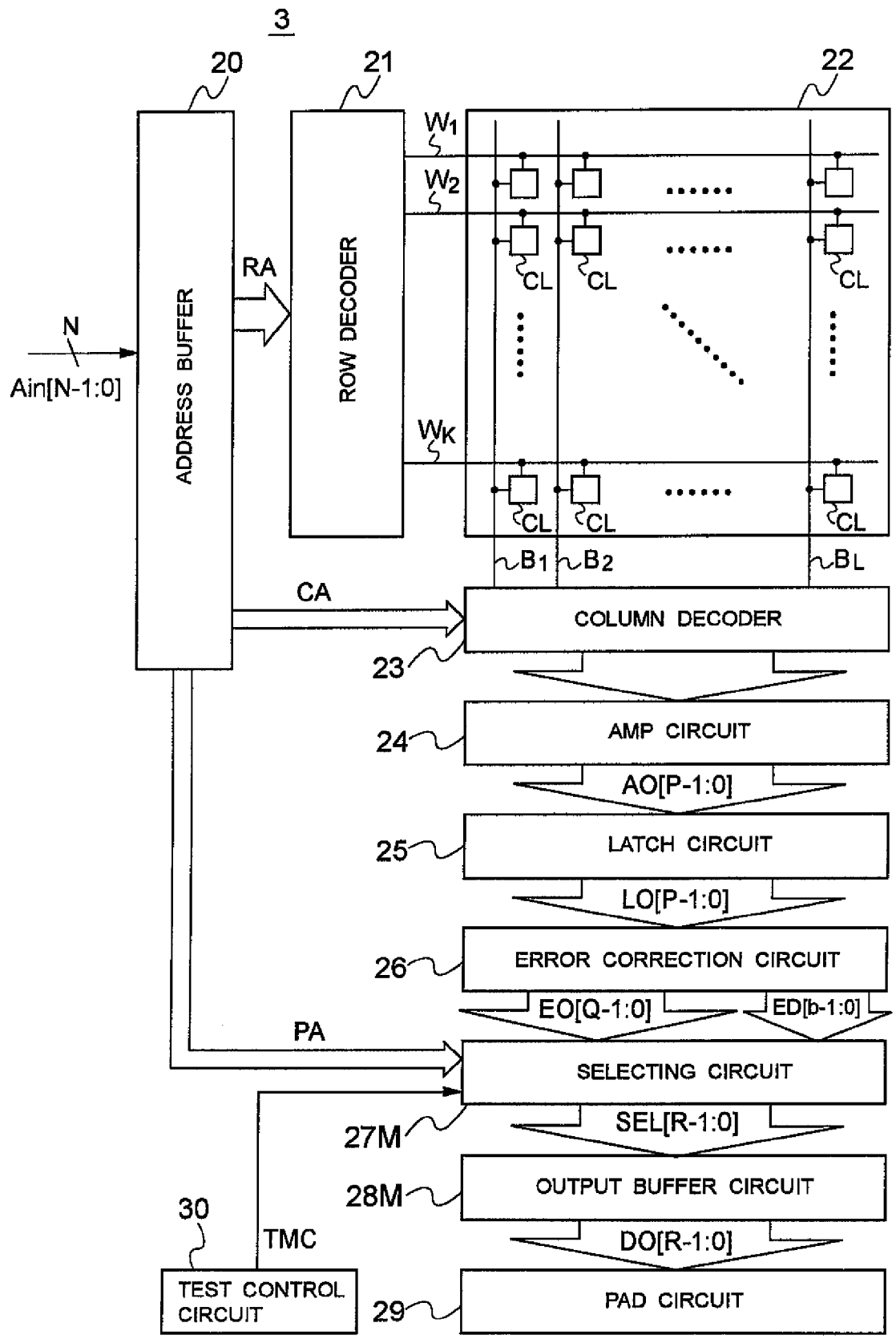
FIG. 15 is a block diagram showing schematically the configuration of a nonvolatile semiconductor memory device of a second embodiment.

Next, a second embodiment of the present invention will be described. FIG. 15 is a block diagram showing schematically the configuration of a nonvolatile semiconductor memory device 3 of the second embodiment. The semiconductor memory device 3 has the same configuration as the semiconductor memory device 2 of the first embodiment except a selecting circuit 27M and an output buffer circuit 28M. The blocks that are common to the semiconductor memory device 2 of FIG. 5 and the semiconductor memory device 3 of FIG. 15 are denoted by the same reference numerals, with detailed description thereof being omitted.

In the second embodiment, the error correction circuit 26 supplies both the error corrected data EO[Q−1:0] and the error detection data ED[b−1:0] to the selecting circuit 27M. When the test control signal TCM is at the L level indicating the normal operation mode, the selecting circuit 27M produces the selected data SEL[R−1:0] from the error corrected data EO[Q−1:0] supplied from the error correction circuit 26. In contrast, when the test control signal TCM is at the H level indicating the test operation mode, the selecting circuit 27M selects the error corrected data EO[Q−1:0] preferentially to produce the selected data SEL[R−1:0].

Figure 16:
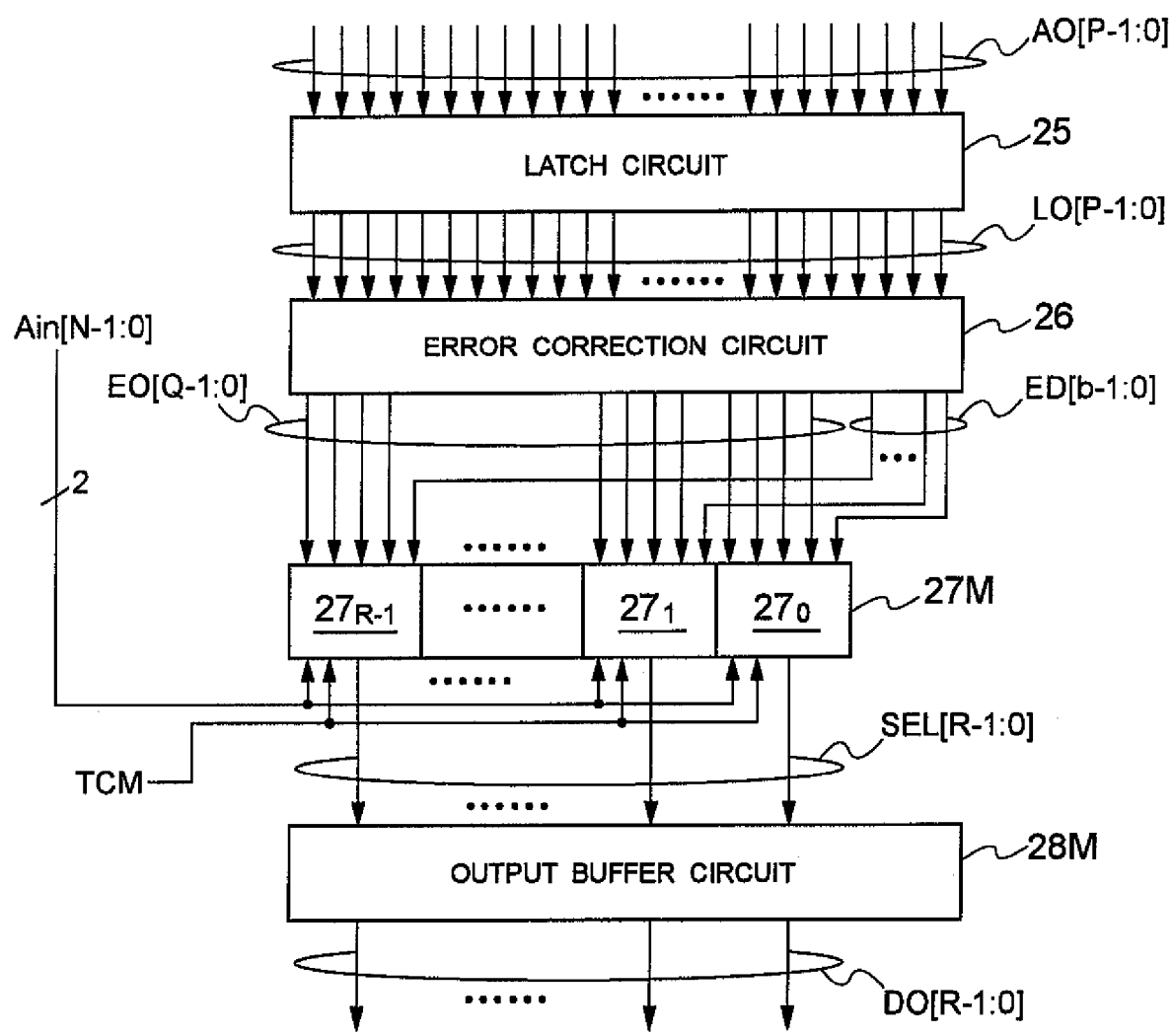
FIG. 16 is a diagram showing schematically the configuration of a selecting circuit.

FIG. 16 shows an example configuration of the selecting circuit 27M. As shown in FIG. 16, the selecting circuit 27M has R multiplexers $27_0$ to $27_{R-1}$. Each multiplexer $27_i$, where i=0 to R−1, selects one of four bits supplied from the error correction circuit 26 according to the page address signal Ain[1:0] and outputs the selected bit when in the normal operation mode. In contrast, when in the test operation mode, each multiplexer $27_i$ selects and outputs a bit ED[i] of the error detection data ED[b−1:0] with masking the page address signal Ain[1:0].

Figure 17:
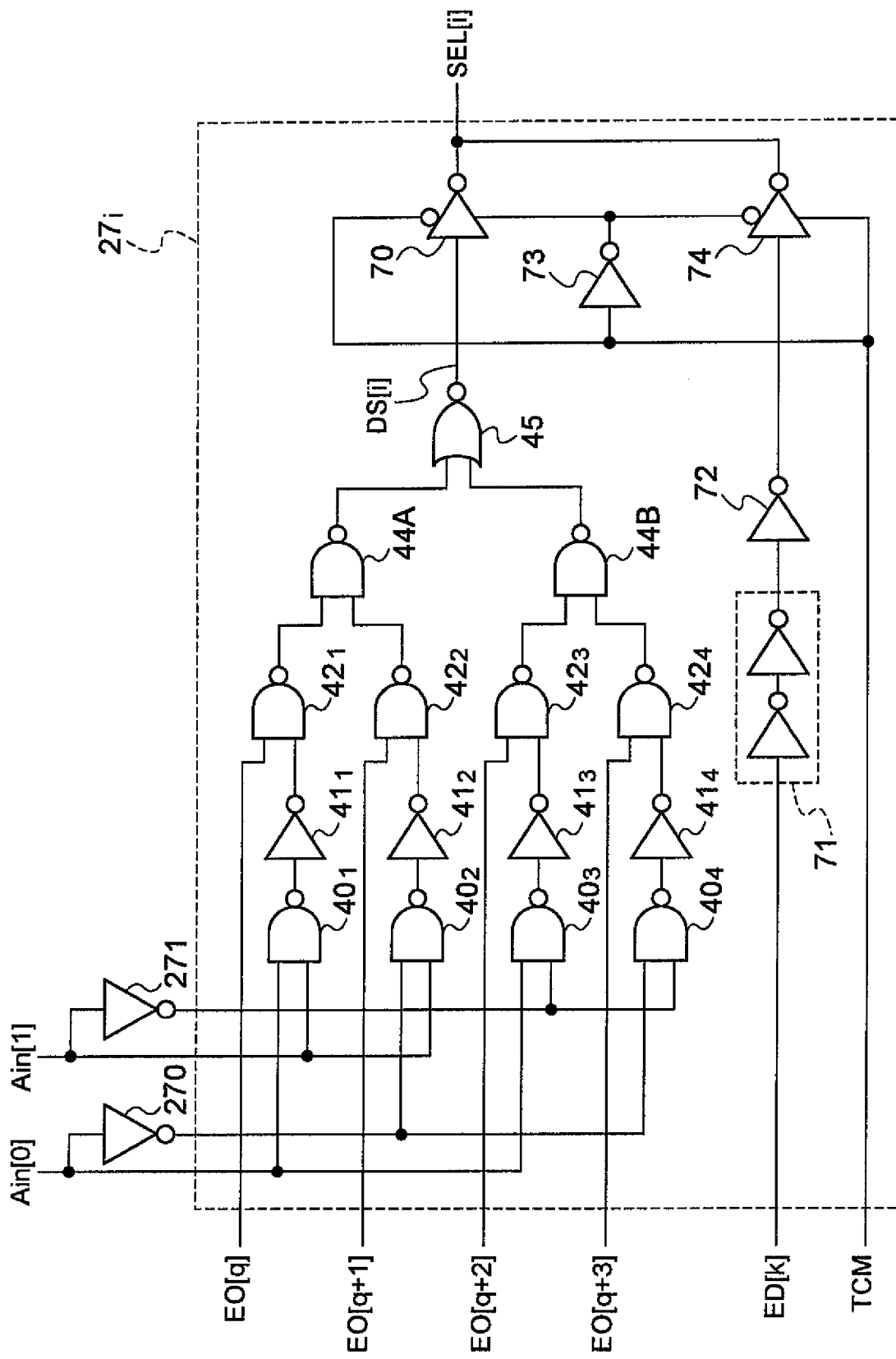
FIG. 17 shows the circuit configuration of a multiplexer forming part of the selecting circuit.

FIG. 17 shows an example of the circuit configuration of the multiplexer $27_i$. As shown in FIG. 17, the least significant bit ($0^{th}$ bit) Ain[0] and the first bit Ain[1] of the page address signal Ain[1:0] are supplied to the multiplexer $27_i$. At the same time the multiplexer $27_i$ is supplied with an inverted bit of the least significant bit Ain[0] from a first inverter 270 and with an inverted bit of the first bit Ain[1] from a second inverter 271. As shown in FIG. 17, the multiplexer $27_i$ comprises a first group of NAND gates $40_1$, $40_2$, $40_3$, $40_4$, inverters $41_1$, $41_2$, $41_3$, $41_4$, a second group of NAND gates $42_1$, $42_2$, $42_3$, $42_4$, a third group of NAND gates 44A, 44B, and a NOR gate 45. The multiplexer $27_i$ further comprises a delay element 71, inverters 72, 73, clocked inverters 70, 74.

The clocked inverter 70 of the clocked inverters 70, 74 shown in the figure goes into a high impedance state when the test control signal TCM is at the H level and becomes an inverter when the test control signal TCM is at the L level. Meanwhile, the other clocked inverter 74 becomes an inverter when the test control signal TCM is at the H level and goes into a high impedance state when the test control signal TCM is at the L level.

Figure 18:
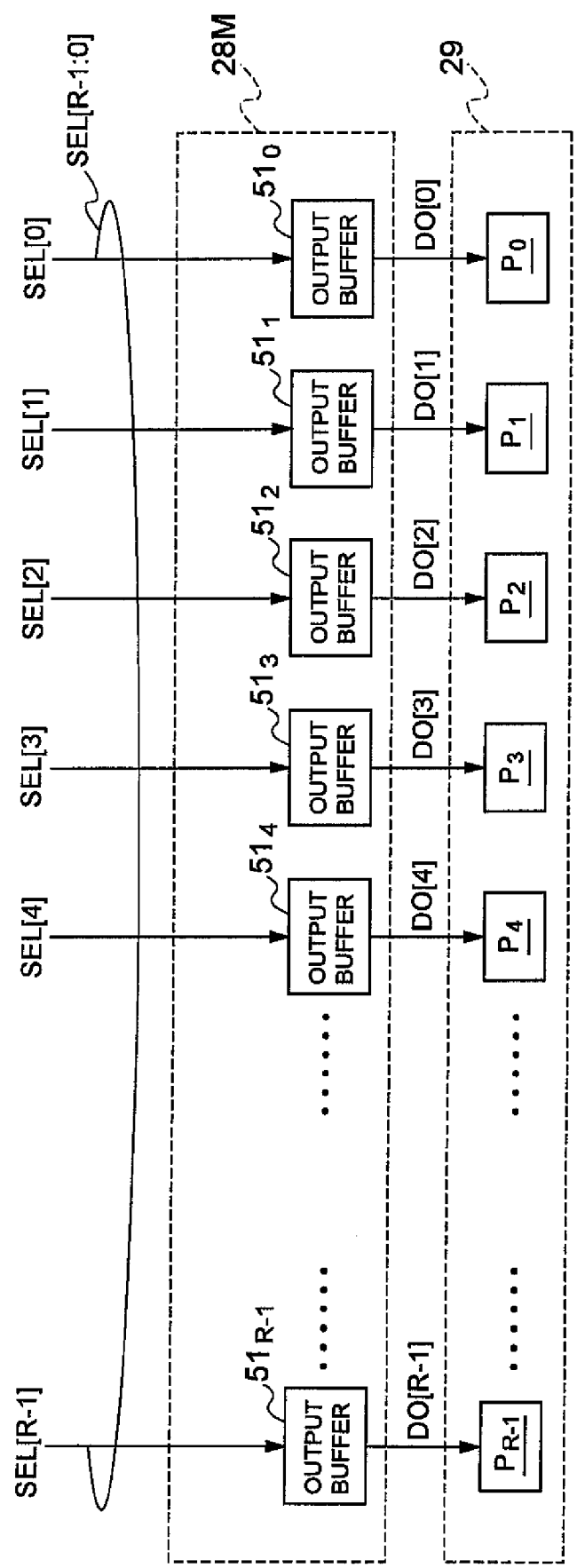
FIG. 18 shows schematically the configuration of an output buffer circuit.

FIG. 18 shows the configuration of the output buffer circuit 28M. The output buffer circuit 28M of FIG. 18 comprises R output buffers $51_0$ to $51_{R-1}$. Bit outputs DO[0] to DO[R−1] of the output buffers $51_0$ to $51_{R-1}$ are supplied to pads $P_0$ to $P_{R-1}$ forming the pad circuit 29.

As described above, the error corrected data EO[Q−1:0] and the error detection data ED[b−1:0] are transmitted via more identical paths as comparing to FIG. 5 of the first embodiment, and hence the difference in transmission time between the error corrected data EO[Q−1:0] and the error detection data ED[b−1:0] can be minimized. Thus, the access test results can be stabilized. Moreover, the multiplexer $27_i$ of FIG. 17 has a delay element 71 to delay the signal of the kth bit ED[k] of the error detection data. By this means, the error detection data ED[b−1:0] becomes later in transmission than the output bit DS [i] of the NOR gate 45, and hence the access test results can be stabilized.

This application is based on Japanese Patent Application No. 2007-239614 which is hereby incorporated by reference.

What is claimed is:

1. A semiconductor memory device which stores predetermined code words each composed of information bits and parity check bits, comprising:
   a memory cell array having a plurality of word lines and a plurality of bit lines and having a plurality of memory cells respectively formed at places at which said word lines and said bit lines cross over, said memory cells being arranged in a matrix;
   a row decoder to select one of said word lines based on a row address signal;
   a column decoder to select some of said bit lines based on a column address signal;
   an error correction circuit to perform error correction on a code word read through the bit lines selected by said column decoder from ones of said memory cells located at places at which the word line selected by said row decoder and the selected bit lines cross over, thereby detecting an error position in the code word to generate error detection data indicating said error position, and to correct the information bit in said detected error position to generate error corrected data; and
   an output circuit to receive said error detection data and said error corrected data from said error correction circuit,
   wherein said output circuit relays said error corrected data to outside when a normal operation mode has been designated and relays said error detection data to outside when a test operation mode has been designated.

2. A semiconductor memory device according to claim 1, further comprising:
   a test control circuit to supply a control signal indicating either said test operation mode or said normal operation mode to said output circuit,
   wherein said output circuit outputs said error corrected data when said control signal indicates said normal operation mode and outputs said error detection data instead of said error corrected data when said control signal indicates said test operation mode.

3. A semiconductor memory device according to claim 1, wherein when a code word of one page size has been read in bitwise parallel from said memory cell array in a page access mode, said output circuit time divides said error corrected data generated in said error correction circuit sequentially into multiple time divided error corrected data according to an input page address to output consecutively said multiple time divided error corrected data.

4. A semiconductor memory device according to claim 2, wherein when a code word of one page size has been read in bitwise parallel from said memory cell array in a page access mode, said output circuit time divides said error corrected data generated in said error correction circuit sequentially into multiple time divided error corrected data according to an input page address to output consecutively said multiple time divided error corrected data.

5. A semiconductor memory device according to claim 2, wherein said output circuit comprises:
   a selecting circuit to select data from among said error corrected data according to an input page address; and
   an output buffer circuit to output error corrected data selected by said selecting circuit when said normal operation mode has been designated and to output said error detection data supplied from said error correction circuit when said test operation mode has been designated; and
   wherein said output buffer circuit comprises a selector to select either said error detection data supplied from said error correction circuit or the error corrected data selected by said selecting circuit and to output the selected data.

6. A semiconductor memory device according to claim 5, wherein said output buffer circuit comprises delay elements to delay said error detection data.

7. A semiconductor memory device according to claim 2, wherein said output circuit comprises:
   a selecting circuit to select data from among said error corrected data according to an input page address and to select either the selected data or said error detection data supplied from said error correction circuit; and
   an output buffer circuit to relay the data selected by said selecting circuit to outside, and
   wherein said selecting circuit comprises a selector to select the data selected by said selecting circuit according to said input page address when said normal operation mode has been designated and to select said error detection data supplied from said error correction circuit when said test operation mode has been designated.

8. A semiconductor memory device according to claim 7, wherein said selecting circuit comprises delay elements to delay said error detection data.

9. A semiconductor memory device according to claim 1, wherein each said memory cell is constituted by a nonvolatile memory element.

10. A semiconductor memory device according to claim 2, wherein each said memory cell is constituted by a nonvolatile memory element.

11. A semiconductor memory device according to claim 3, wherein each said memory cell is constituted by a nonvolatile memory element.

12. A semiconductor memory device according to claim 4, wherein each said memory cell is constituted by a nonvolatile memory element.

13. A semiconductor memory device according to claim 5, wherein each said memory cell is constituted by a nonvolatile memory element.

14. A semiconductor memory device according to claim 6, wherein each said memory cell is constituted by a nonvolatile memory element.

15. A semiconductor memory device according to claim 7, wherein each said memory cell is constituted by a nonvolatile memory element.

16. A semiconductor memory device according to claim 8, wherein each said memory cell is constituted by a nonvolatile memory element.

* * * * *